United States Patent [19]

Landsman

[11] 4,334,770
[45] Jun. 15, 1982

[54] METHOD AND APPARATUS FOR MANIPULATING AND TRANSPORTING IMAGE MEDIA

[75] Inventor: Robert M. Landsman, Annandale, Va.

[73] Assignee: LogEtronics, Inc., Springfield, Va.

[21] Appl. No.: 166,433

[22] Filed: Jul. 7, 1980

Related U.S. Application Data

[62] Division of Ser. No. 972,628, Dec. 22, 1978, Pat. No. 4,262,594.

[51] Int. Cl.³ ............................................. G03B 27/22
[52] U.S. Cl. ................................. 355/104; 346/110 R; 428/146
[58] Field of Search ................................. 355/47–49, 355/85–87, 91–94, 104–111, 117; 271/3; 346/24

[56] References Cited

U.S. PATENT DOCUMENTS

| | | | |
|---|---|---|---|
| 1,584,897 | 7/1925 | Haynes | 184/18 |
| 1,746,407 | 2/1930 | Schroter et al. | |
| 1,792,264 | 2/1931 | Alexanderson | |
| 2,153,917 | 4/1939 | Exline | |
| 2,511,892 | 6/1950 | Wise | 346/24 |
| 2,560,696 | 7/1951 | Huebner | 355/85 |
| 2,649,034 | 7/1953 | Jelinek, Jr. | 428/146 |
| 2,672,503 | 3/1954 | Hallden et al. | |
| 2,816,001 | 12/1957 | Hallden et al. | |
| 3,170,381 | 2/1965 | Wanielista | 355/93 |
| 3,293,657 | 12/1966 | Silverman | 346/110 R |
| 3,303,507 | 2/1967 | Lehner et al. | |
| 3,642,368 | 2/1972 | Moss | 355/47 |
| 3,922,772 | 12/1975 | Ericsson | 101/382 MJ |
| 3,958,250 | 5/1976 | Rolon | 346/24 |
| 3,966,187 | 6/1976 | Beduchaud | 271/3 |
| 4,037,957 | 7/1977 | Lallement | 355/91 |

Primary Examiner—Richard A. Wintercorn
Attorney, Agent, or Firm—Hall, Myers & Rose

[57] ABSTRACT

A conveying mechanism and flexible carrier for transporting a planar printing plate and flexible overlying mask from a flat loading station to a precisely-curved cylindrically-shaped scanning station, and back to the flat loading station, is disclosed. The vacuum carrier used is rigid in one axis and flexible in a second axis, and has a pair of reference strips which define a neutral bending axis for the plate and mask when the latter are wrapped around a pair of precisely machined cylindrical discs. By locating the flexible mask and printing plate outside the neutral axis of bending, both are placed in tension when wrapped around the discs. This maintains uniform contact between the plate and mask and prevents wrinkling of the mask as it overlies the plate.

The carrier and discs support the plate and mask within a precise and uniform cylindrical plane for scanning with focussed beams of radiation. The transport mechanism applies a vacuum to the carrier while in its flat position and maintains the vacuum while wrapping the carrier around the spaced cylindrical reference discs. When the image scanning is completed, the transport mechanism returns the carrier to its flat state for unloading of the printing plate and mask.

17 Claims, 11 Drawing Figures

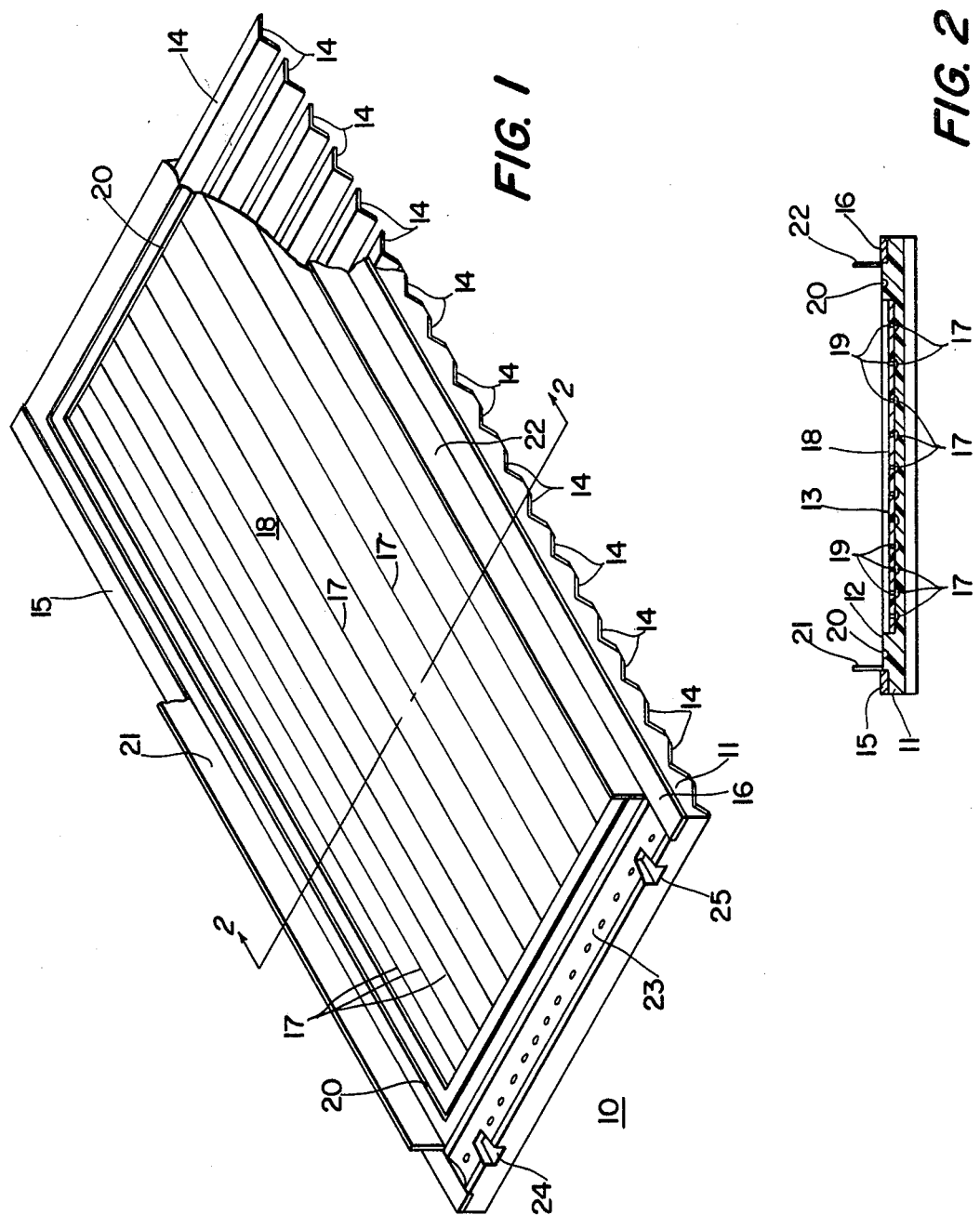

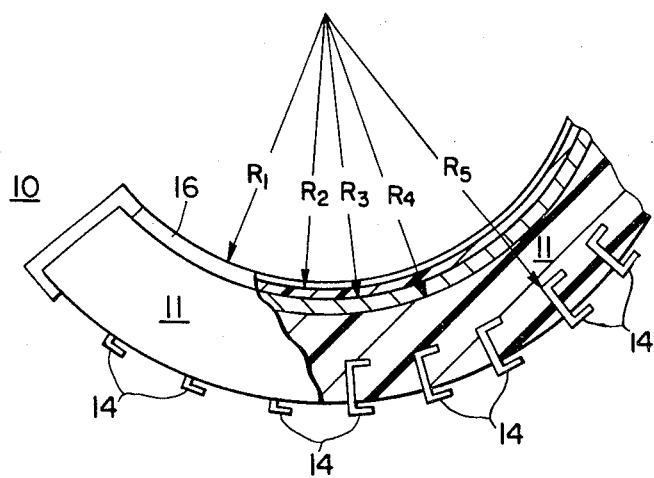
FIG. 3
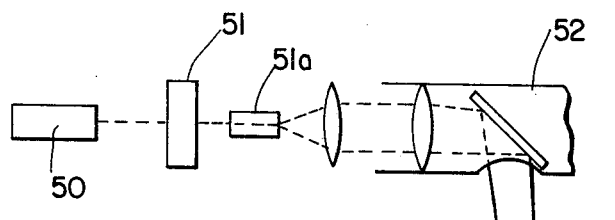
FIG. 4
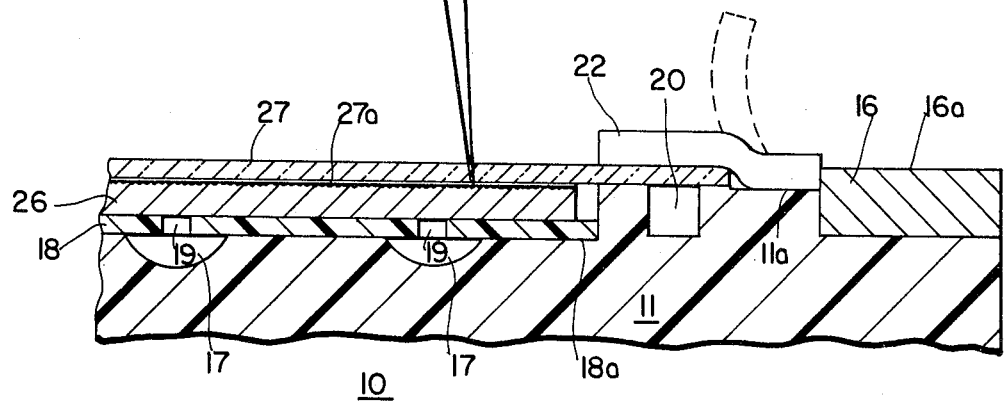

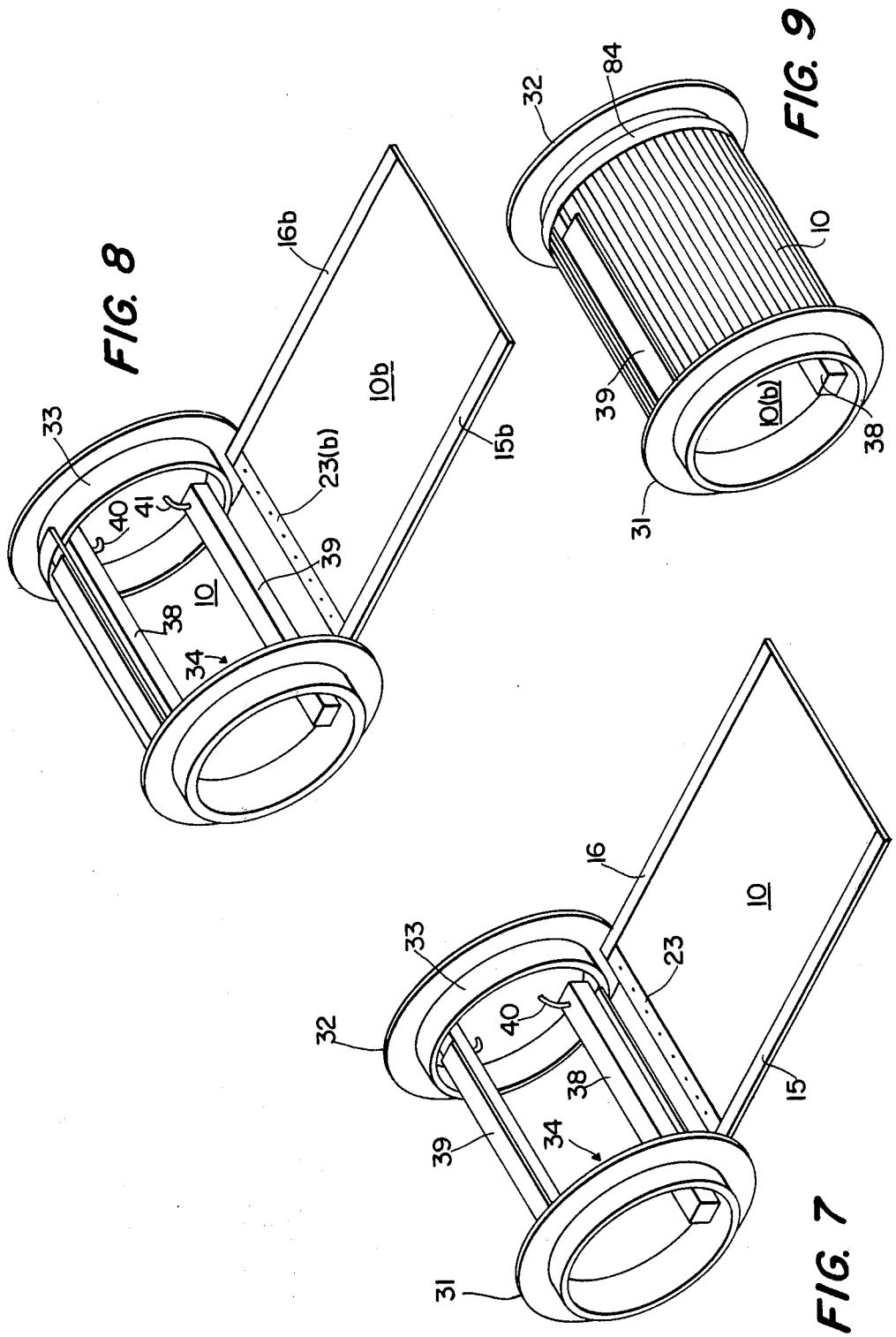

METHOD AND APPARATUS FOR MANIPULATING AND TRANSPORTING IMAGE MEDIA

This is a division of application Ser. No. 972,628, filed Dec. 22, 1978, now U.S. Pat. No. 4,262,594, issued Apr. 21, 1981.

BACKGROUND OF THE INVENTION

The present invention relates to a method and apparatus for transporting and manipulating flat image recording media from a flat loading station into a precise cylindrical plane for scanning thereof. It is particularly adapted for use with one or more of the following disclosures:

Landsman, U.S. Pat. No. 3,738,088 issued June 12, 1973 entitled "Printing Plate Production Method and Apparatus"

Landsman, U.S. Pat. No. 3,742,853 issued July 3, 1973 entitled "Method of Forming a Relief Printing Plate"

Landsman, U.S. Pat. No. 3,779,779 issued Dec. 18, 1973 entitled "Radiation Etchable Plate"

Landsman, U.S. Pat. No. 3,816,659 issued June 11, 1974, entitled "Scanning Apparatus"

Landsman, U.S. Pat. No. 3,945,318 issued Mar. 21, 1976, entitled "Printing Plate Blank and Image Sheet by Laser Transfer"

Landsman, U.S. Pat. No. 3,991,145 issued Nov. 9, 1976, entitled "Method of Making a Printing Plate from a Porous Substrate"

Landsman, U.S. Pat. No. 3,999,918 issued Dec. 28, 1976 entitled "Printing Plate Made from a Porous Substrate"

Landsman, U.S. Pat. No. 4,064,205 issued Dec. 20, 1977 entitled "Method of Making a Printing Plate from a Porous Substrate"

Landsman, U.S. Pat. No. 4,131,916 to be issued on Dec. 26, 1978 entitled "Pneumatically Actuated Image Scanning Reader/Writer."

Each of the foregoing references is assigned to the assignee of this application.

The present invention is particularly suited for use with the Pneumatically Actuated Image Scanning Reader/Writer, U.S. Pat. Nos. 4,131,916 and The Printing Plate Blank and Image Sheet by Laser Transfer, U.S. Pat. No. 3,945,318. In these earlier applications a grained aluminum printing plate is overlaid with a carbon black imaging mask and this pair of image receiving media is formed into a precise cylindrical plane for scanning by a focussed beam of energy from an infrared laser. Whenever the beam impacts upon the carbon black imaging sheet, the carbon black is transferred to the aluminum plate. To obtain the necessary resolution and transfer characteristics, it is necessary that the entire sandwich of materials be formed into a precise cylindrical plane with a maximum radial variation of less than plus or minus 0.007 inches.

The invention is particularly suited to the rapid burning of printing plates for use in newspaper or other high-volume printing applications, wherein it is desirable to rapidly and inexpensively produce aluminum printing plates direct from camera-ready art in the form of paste-up sheets and the like.

PRIOR ART STATEMENT

The problem of transporting a flat sheet of image receiving media to a curved exposure station has been addressed in a variety of photographic, xerographic, heat transfer, printing and stenciling processes. These processes have found use in facsimile machines, printing machines, platemakers and silk-screen presses. For convenience, the prior art references have been placed in groups with the most relevant references of each group discussed in detail.

FIRST GROUP OF PRIOR ART REFERENCES

The first group of prior art references, namely U.S. Pat. Nos. 3,293,657 issued to D. Silverman on Dec. 20, 1966; 3,922,772 issued to Sylde Ericsson on Dec. 2, 1975; and 3,958,250 issued to Arnaldo Rolon on May 18, 1976 all relate to cylindrical drums wherein an image-sensitive material is adhered by vacuum to the inside or outside of the drum for scanning or recording purposes. This group is deemed relevant inasmuch as the printing plate and the mask of the instant invention are adhered to the carrier by vacuum after being curved into a cylindrical configuration. In each of the references the material is adhered directly to the drum by a vacuum drawn through perforations in the drum. Furthermore, U.S. Pat. Nos. 3,293,657 and 3,958,250 each use smoothing rollers to roll the sensitized material against the drum surface. Applicant's invention may be distinguished from these references in that applicant uses a carrier for the sensitized material, and uses the carrier and cylindrical discs to define a precise cylindrical plane for scanning and exposure of the material.

SECOND GROUP OF PRIOR ART REFERENCES

The second group of prior art references is distinguished from the first group in that they teach the exposure of one or more sheets of sensitized material in a cylindrical plane. This group of references includes U.S. Pat. Nos. 2,560,696 issued to W. C. Huebner on July 17, 1951 and 3,170,381, issued to W. Wanielista on Feb. 23, 1965 and assigned to the assignee of the present application. Both of these references disclose the use of a thin transparent cover sheet which seals the openings in the drum through which the vacuum is drawn. It should also be noted that these prior art devices use adhesive tape around the exterior periphery of the multiple sandwich to isolate the sandwich from contact with the outside air. Applicant's device may be contrasted with these references in that the present invention uses a vacuum carrier to maintain the plate and mask in an intimate relationship for exposure and does not require the use of adhesive tape. While the efficacy of adhesive tape is not disputed, it is not well suited for use in a high-volume platemaking apparatus.

THIRD GROUP OF PRIOR ART REFERENCES

The third group of prior art references is distinguished from the foregoing groups in that each of the following references uses a continuous strip of material that is wrapped around or within a cylindrical drum for exposure. These references are U.S. Pat. Nos. 1,746,407 issued to F. Schroter et al. on Feb. 11, 1930; 1,792,264 issued to E. F. W. Alexanderson on Feb. 10, 1931; and 3,303,507 issued to F. E. Lehner et al. on Feb. 7, 1967. The Lehner reference bears the greatest similarity to applicant's device in that it uses an energy source, a turbo shaft, and a rotating spinning mirror within the cylindrical drum to focus the radiant energy upon the sensitized material. It should be noted, however, that the Lehner and Alexanderson references disclose the use of a transparent drum for the focal reference plane. While this method is suitable for photogrphic exposure, it is not suited to the use of a laser beam wherein precise amounts of focussed infrared energy are impinged upon the imaging mask. The gases generated within the confined space by the heat and energy transfer would distort the materials and damage the transparent platen. It should be pointed out that applicant's invention may be further distinguished from these references in that applicant uses a flexible vacuum carrier for supporting materials in the precise cylindrical plane.

FOURTH GROUP OF PRIOR ART REFERENCES

The fourth group of prior art references has been grouped together because each one uses a card or other similar resilient substrate for receiving the image recorded thereon. The references, namely U.S. Pat. Nos. 1,584,897 issued to C. H. Haynes on July 14, 1925; 2,153,917 issued to P. G. Exline on Apr. 11, 1939; and 2,511,892 issued to Ralph Wise on June 20, 1950, all teach the use of a drum or pair of cylinders to support a relatively stiff card for recording purposes. The only similarity between these references and applicant's invention is the use of the relative stiffness of one of the image receiving media.

Applicant's invention is particularly suited to the use of a resilient aluminum plate and flexible carbon black mask. In each case a natural resilience of the aluminum plate, or of the card stock material of the prior art application, is used in forming the precise cylindrical surface. Beyond this similarity, however, these references are not deemed relevant to applicant's invention.

FIFTH GROUP OF PRIOR ART REFERENCES

All of the prior art references in the fifth group are related to the same device and disclose different inventions that were used in its perfection. They include U.S. Pat. Nos. 2,649,034 issued to C. Jelinek, Jr., on July 28, 1953; 2,672,503 issued to F. G. Hallden et al. on Mar. 16, 1954; and 2,816,001 issued to F. G. Hallden et al. on Dec. 10, 1957. The relevance of this group of references is best illustrated in FIG. 21 and FIGS. 30-32 of U.S. Pat. No. 2,672,503. (See columns 13-14.) These references disclose a phosphor bronze carrier for supporting the card stock and for bending the carrier around a pair of cylindrical flanges, as illustrated in FIG. 30.

In the preferred embodiment of applicant's invention, phosphor bronze reference strips are used in cooperation with a pair of spaced cylindrical discs to define a precise cylindrical plane and a neutral axis of curvature at their respective points of contact. The selection of the neutral axis of curvature is critical in the formation of a precise cylindrical plane with plural substrates. Whenever plural substrates are bent into a curved plane, one of the materials must necessarily slide with respect to the other or bending and wrinkling of the thinner substrate will result. Applicant's invention uses a carrier which places the image receiving media outside the neutral axis of curvature so that each part of the plural substrate is tensioned with respect to the neutral axis of curvature.

In the Hallden reference, U.S. Pat. No. 2,672,503 the material to be exposed is placed on the inside of the phosphor bronze carrier, and consequently is inside the axis of curvature defined between the phosphor bronze carrier and the cylindrical flanges. Hallden is concerned with only a single substrate and uses the flanges 187 to secure the image receiving material to the carrier. While this might be suitable for use with a relatively small card, it is not suitable for use with large printing plates spanning 15 to 20 inches without intermediate support. Applicant's device may be further contrasted from this group of references in that applicant uses a vacuum carrier with a plurality of longitudinally stiffening support members to ensure that the image receiving media is supported in a precise cylindrical plane across its entire area.

Finally, Applicant cites U.S. Pat. No. 3,966,187 issued to Michel Beduchaud on June 29, 1976 entitled "Device for Loading a Sheet on a Rotating Drum." While the mechanical means used to carry out the conversion of a flat sheet to a cylindrical plane by winding and unwinding is substantially different than the mechanical device used by applicant, it is felt that this reference is relevant to portions of applicant's method of transporting and forming an image receiving media to a precise curvature. Applicant's method claims may be distinguished from this reference in that applicant uses a vacuum to adhere the image receiving media to the carrier which is, in turn, gripped by the drum. In the Beduchaud reference the paper is gripped directly by, and rotated around, the drum.

OBJECT OF THE INVENTION

It is therefore an object of the present invention to disclose a method and apparatus for transporting a flat image receiving media from a first flat work station to a precisely curved image scanning work station and returning it to the flat work station. It is a further object of this invention to disclose a method and apparatus that will maintain a precise cylindrical curvature wherein the focal plane defined by the apparatus does not vary more than plus or minus 0.007 inches.

It is an additional object of this invention to disclose a method and apparatus whereby uniform contact may be maintained between a relatively stiff substrate and a flexible overlying substrate when the two are curved into a precise cylindrical plane with the flexible substrate on the inside of the cylindrical plane.

Yet another object of the present invention is to disclose a method and apparatus for achieving a neutral axis of curvature for plural substrates whereby wrinkling or separation of the substrates when they are bent into a precise cylindrical curvature is avoided.

It is also an object of the present invention to disclose a method and apparatus for scanning and exposing a plurality of printing plates and carriers in a single operation, and to provide a method and apparatus for rapidly loading, exposing, and unloading said plates in a scanning mechanism wherein the production rate of the mechanism is of primary importance.

Another object of the present invention is to provide a mechanism which may be used for transporting any flat image receiving media from a first planar work station to a curved work station wherein the material may be exposed by any one of a variety of energy sources. It is a further object of the invention to provide a method and apparatus for supporting an image receiving media in a precise cylindrical plane to provide extremely high resolution when the image receiving media is exposed.

BRIEF DESCRIPTION OF THE DRAWINGS

FIG. 1 is an isometric and cutaway view of the vacuum carrier of the present invention.

FIG. 2 is a cross section of the vacuum carrier taken along Section Line 2—2 of FIG. 1.

FIG. 3 is a partial cross-sectional view of a portion of the vacuum carrier, illustrating the neutral axis of curvature.

FIG. 4 is an enlarged cross section of a portion of the carrier illustrated in FIG. 1.

FIG. 7 is a diagramatic view of the transport mechanism and carrier of the present invention.

FIG. 8 is a diagramatic view of two carriers and the transport mechanism of the present invention.

FIG. 9 is a diagramatic view of the transport mechanism and of two carriers formed into a cylinder.

DESCRIPTION OF THE PREFERRED EMBODIMENT

Figure 5:
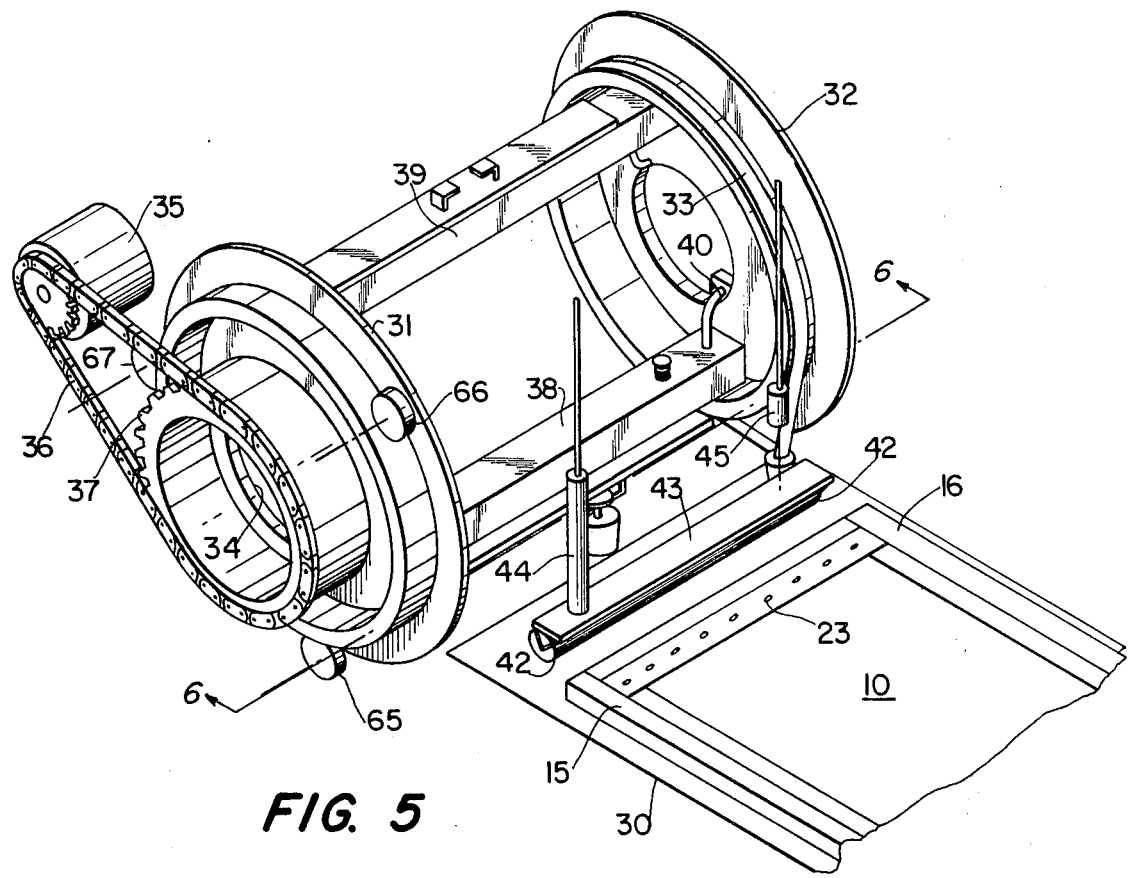
FIG. 5 is an isometric and diagramatic view of the carrier and transport mechanism of the present invention.

FIG. 1 is an isometric, partial cross-sectional view of the carrier of the present invention. This carrier is particularly adapted to be used in a laser platemaking system that reads and writes on concave cylindrical surfaces. The latter device has a pair of rotating laser beams focused on theoretical surfaces that are defined by pairs of rotating discs having precise radii. The circumferential surfaces of each spaced pair of discs define precise cylindrical reference planes therebetween.

The plate materials that are to be read or written upon are thin, flat and flexible and are placed on the carrier illustrated in FIG. 1, in a flat position. They are then drawn smoothly into engagement with the carrier by means of vacuum, before being carried into the machine and around the discs. When the carrier is clamped tightly to the precision discs it then produces the precise cylindrical reference plane required to hold the materials at the focus of the laser beams. For the foregoing reasons, the vacuum carrier must be designed and constructed so as to accept the flat, flexible materials with simple handling motions and to align them accurately to their reference locations before they are sucked down smoothly into contact with the surface of the carrier by the application of vacuum. The transport of the carrier into the correct reference location inside the machine must be accomplished quickly and precisely so that the resultant concave interior surface produced by the carrier becomes accurately cylindrical within the plus or minus 0.007 inch focal budget defined by the laser focusing system. To produce this cylindrical surface the carrier must be resilient in its longitudinal direction, as illustrated in FIG. 1, and stiff in its lateral direction, with rigid cross bars to prevent flexing thereof when the carrier is wrapped around the pair of spaced cylindrical discs.

The materials to be written on in the preferred embodiment of the present invention were more precisely described in my prior U.S. Pat. No. 3,945,318 issued Mar. 21, 1976 and entitled "Printing Plate Blank and Image Sheet By Laser Transfer." It is to be understood that the present invention is not restricted to such a printing plate and laser mask combination, and has far and wide application wherever plural image receiving media are to be formed into cylindrical planes for purposes of exposure to radiant energy.

One problem that is solved with the present invention is that of wrinkling of the innermost image receiving media when it is compressed during the curving or cylinder forming operation. In the present invention, a relatively stiff aluminum printing plate is covered with a thin, flexible plastic laser mask, and the two are formed into a precise cylindrical plane. Wrinkles are avoided by positioning both the aluminum printing plate and the laser mask outside the neutral axis of curvature for the combined plural media. This is done by placing the sides of the carrier a pair of reference strips having a high modulus of elasticity, and positioning these strips above the supporting surface of the carrier. When the carrier is curved, the metal bands which constitute the reference strips are placed into contact with the cylindrical discs and define a smaller radius of curvature than that of the combined plural substrate. The thin flexible laser mask is stretched slightly with respect to these reference strips, and the elastomeric base of the carrier is stretched even further. The application of a stretching force to the composite substrate during curvature prevents the formation of wrinkles in the thin laser mask material.

The Carrier

As illustrated in FIGS. 1 and 2, the carrier 10 comprises a flexible support member 11 that defines first and second reference planes 12 and 13 (illustrated in FIG. 2) for receiving first and second recording media wherein the second media overlies the first. The carrier also includes a plurality of longitudinal braces 14 which provide stiffness along one planar axis of the carrier whereby the carrier is made relatively rigid in one dimension but flexible in its second dimension. The carrier also defines a pair of reference strips 15 and 16 which are mounted, perpendicular to longitudinal braces 14, on the flexible support member 11 on either side of the first and second reference planes 12 and 13. A plurality of vacuum passageways 17 are defined within the first reference plane by the flexible carrier 11, to exhaust air trapped between the first image recording media and the carrier. In the preferred embodiment of the invention, the carrier also includes a perforated elastic sheet 18 having a plurality of openings 19 that communicate with the vacuum channels 17 to aid in exhausting air from between the first image media and the carrier.

The carrier also defines a peripheral vacuum channel 20 which extends around the first reference plane 12 and is used to evacuate air between the first and second image recording media, and from between the second recording media and the carrier. It is to be understood the second media or laser mask overlies the first recording media or aluminum printing plate and extends beyond the printing plate on all four sides to cover the vacuum channel 20. If desired, the carrier may also include a pair of retaining flaps 21 and 22 which are hingedly mounted on the flexible support member immediately adjacent reference strips 15 and 16 to extend inwardly and cover the parallel edges of the second recording media when the carrier is inserted into the transport mechanism.

The carrier includes an air manifold means generally indicated at 23. Manifold 23 is adapted to be engaged by a carrier engaging means to be described hereinafter. It interconnects the air passageways 17 and the peripheral vacuum channel 20 with the vacuum passageways 46 defined by the carrier engaging means 38. During operation of the device, a vacuum is established via the carrier engaging means 38, vacuum passageways 46, manifold means 23, peripheral vacuum channel 20, and the openings 19 to exhaust air entrapped between the first and second overlying image recording media, and between the first media and reference plane 13. Carrier 10 also defines a pair of registration openings 24, 25 adapted to engage a pair of registration pins mounted on the carrier engaging means.

The unique construction of the carrier is more fully described with respect to FIGS. 3 and 4. As illustrated in FIG. 4, which greatly exaggerates the relative thicknesses of the various components in order to more clearly illustrate the principles involved in the operation of the carrier and transport mechanism, carrier 10 includes an elastomeric substrate 11 defining a first reference plane for receiving an aluminum printing plate 26, and a second reference plane for receiving a thin flexible laser mask 27.

As was more fully described in my previously-referenced prior U.S. Patents, the present invention is particularly adapted for use with a laser source 50, a laser beam modulator 51, beam expander 51a and a helical scanning means 52 that provides a precisely focused beam of laser energy 53 which impacts on the laser mask 27. Laser mask 27 comprises a thin flexible transparent plastic substrate having a carbon black layer thereon. In the preferred embodiment of the invention, it has been found that a laser mask of approximately 0.003" thickness is quite suitable in effecting selective transfer of carbon black to the aluminum printing plate 26. In contrast, a grained aluminum printing plate 26 is on the order of 0.012" thick and is carried by the flexible carrier, which is approximately 0.75" thick.

The "focal budget" for the focused laser beam 53 is plus or minus 0.007 inches across the surface of the carrier in the preferred embodiment. The preferred embodiment is particularly suited to the rapid production of newspaper printing plates having dimensions of approximately 17"×24—. Thus it can be seen that in order to achieve the required image resolution image resolution the cylindrical plane must be precisely defined. In actual practice with the preferred embodiment, it has been found that resolution on the order of 100 to 130 lines per inch is achieved with the present invention. This renders it suitable for virtually all printing applications inasmuch as most newspapers are printed with 55 to 85 lines per inch resolution.

The carbon black layer 27a is transferred from the laser mask to the aluminum substrate 26 by means of the focussed beam of energy 53 while the scanning apparatus 52 is rotating at speeds as high as 6,000 rpm at the axis of the cylindrical plane. Certain dimensional tolerances are therefore necessary to accomodate the characteristics of the optical and scanning components. The total focal budget of plus or minus 0.007 inches must include all of the optical and scanning errors, and leaves a true focal budget for the aluminum plate and the carbon black layer of approximately plus or minus 0.003 to 0.004 inches. Thus it can be seen that it is essential that the carbon black mask overlie the aluminum plate smoothly, without wrinkles or air bubbles that would otherwise destroy the resolution of the image transferred to the printing plate. An air bubble or wrinkle will lift the carbon black layer illustrated in FIG. 4 upwardly out of the critical zone of focus for the laser beam 53. In addition, the carbon black will drift or scatter as it transfers from the transparent substrate 27 to the aluminum plate 26 if there is any significant separation between the two layers. Hence it is critical that the laser mask shall adhere intimately to the aluminum plate 26 during the scanning operation.

As illustrated in FIG. 4, the vacuum passageway 17 and openings 19 exhaust any air lying between carrier 10 and aluminum printing plate 26. The vacuum channel 20 exhausts any air lying between the laser mask 27 and the aluminum plate 26 and any air lying between the laser mask 27 and the carrier substrate 11. The flexible flaps 22 define a means to retain the plate and laser mask in position in the event of loss of vacuum adhesion between the substrates. As will be hereinafter described, the transport mechanism further defines a roller mechanism that will engage the upper surface of the second recording media 27 to traverse the media as the carrier is fed into the transport mechanism. This roller thereby rolls out any air that is trapped between the first image recording media 26 and the second image recording media 27.

The initial attempts to form plural image receiving media into a precise cylindrical plane were fraught with many difficulties. When the combined substrate, including a relatively stiff plate 26 and a thin flexible member 27, was rolled into a cylindrical plane with the thin flexible mask on the inside, wrinkling invariably resulted. In any curving operation involving plural media, one media must slide relative to the other as their respective radii of curvature change. The present invention solves the problem of curving plural media into a precise cylindrical plane, and avoids wrinkling of the innermost image receiving media.

As illustrated in FIG. 3, it was found that if the carrier 10 is equipped with relatively stiff reference strips 16 having a modulus of elasticity in excess of that of any member of the substrate, the reference strips will define a radius of curvature R1 with respect to the precise cylindrical discs when the carrier is wrapped around the discs. Radius R1 then becomes the neutral axis of curvature, with any radii smaller than R1 being located inside the neutral axis of curvature and any radii greater than R1 being located outside the neutral axis of curvature. As is shown in FIG. 3, the thin flexible laser mask 27 lies at radius R2, outside the neutral axis of curvature. This means that as the laser mask is curved into the configuration illustrated in FIG. 3 it is also being stretched slightly with respect to its original flat dimension. Furthermore, R3 illustrates the radius of curvature of the aluminum plate, which also lies outside the neutral axis of curvature R1. The aluminum plate 26 is also tensioned with respect to its original flat dimension. Radius R4 indicates the innermost dimension of the elastomeric substrate 11 of carrier 10, which is now tensioned with respect to its original dimension in its flat form. R5 illustrates the radius of the outermost layer of the elastomeric substrate 11 which has been substantially tensioned with respect to its original dimension. As illustrated in FIG. 3, the longitudinal stiffening means 14 are spaced apart from one another and are essentially free to expand circumferentially as elastomeric substrate 11 expands.

In FIG. 3, R1 defines the "neutral axis of curvature" or the "precise cylindrical plane" of the present invention, while R4 defines the first reference plane for receiving a first image recording media. This reference plane is defined by the upper surface 18a of layer 18, as illustrated in FIG. 4. The carrier 10 also defines the second reference plane for receiving a second image recording media. The second reference plane is defined by the upper surface 11a of the elastomeric member 11, and constitutes R3 illustrated in FIG. 3.

While the present invention has been described with respect to a laser mask and aluminum plate for use in apparatus for the production of printing plates by laser scanning, it should be understood that the invention is by no means limited to this environment. Applicant's invention, for example, has utility in the contact printing of aluminum printing plates from overlying photographic negatives, using conventional ultraviolet or other photo-actinic light sources.

The Transport Mechanism

The transport mechanism for transporting carrier 10 from its flat position to a precise cylindrical plane, and then back to its initial position, is illustrated in FIGS. 5-11 inclusive.

As shown in FIG. 5, carrier 10 is placed upon a flat support member 30 which is positioned to feed the carrier into tangential engagement with a pair of spaced cylindrical discs 31, 32 in which the "cylindrical reference discs" of the present invention are defined by inwardly extending flanges 33 and 34. The pair of spaced cylindrical discs are mounted for rotation about a common axis, as illustrated in FIG. 5, by drive means 35, chain 36 and sprocket drive wheel 37 secured to disc 31. The spaced cylindrical discs 31, 32 also carry a pair of gripping means generally indicated at 38 and 39, one of which can engage carrier 10 and secure it to flanges 33, 34 of the discs. After a carrier has been engaged by gripping means 38, motor means 35 will rotate the discs to wrap the carrier around the discs whereby the planar surface of the carrier is formed into a precise cylindrical plane concentric with the axis of the discs.

In the preferred embodiment, the cylindrical discs have two carrier engaging or gripping means 38 and 39 spaced approximately 180 degrees apart on the cylindrical plane. These are adapted to engage a pair of carriers for a single scanning operation. While two carriers and two gripping means are disclosed in the present invention, it should be understood that a larger number of carriers could be retained on the discs if multiple gripping means were provided around the periphery of discs 31, 32.

In operation, the first and second image receiving media are superimposed on a carrier 10 at the position illustrated in FIGS. 5, 7. This carrier defines a pair of flexible reference strips 15, 16 on opposite sides of the image receiving media. The flexible carrier is then moved manually into engagement with gripping means 38 attached to the pair of spaced cylindrical reference discs 33, 34 wherein these discs define a precise cylindrical reference plane therebetween. A vacuum is drawn through vacuum holes 46, gripping means 38, plenum 23, and the vacuum passageways of carrier 10 to exhaust the air from between the image receiving media and the surface of the carrier. After sufficient vacuum has been achieved the discs are automatically rotated by drive means 35 to draw the flexible carrier around discs 33, 34 with the reference strips 15 and 16 contacting the discs.

As shown in FIG. 8, a second carrier 10b is then positioned on the support surface, to be engaged by the second gripping means 39. As carrier 10b is brought into tangential engagement with discs 33, 34, the gripping means 39 draws a vacuum through manifold 23b to secure the image recording media to the carrier. After the vacuum has been achieved the discs will again be rotated 180 degrees by drive means 35 to the position illustrated in FIG. 9.

As illustrated in FIG. 9, a first carrier 10 has been wrapped in one-half of a precise cylindrical plane, while a second carrier 10b forms the other half of the cylindrical plane. In this way maximum use is made of the helical scanning mechanism, which scans the entire inner surface of the cylindrical reference planes defined by carriers 10 and 10b.

Referring again to FIG. 5, a pressure roller 42 is positioned across the width of support surface 30 to engage carrier 10 as it is brought into tangential engagement with discs 33, 34. Roller 42 is suspended from support frame 43 and is biased downwardly against carrier 10 by means of springs located in the tensioning means 44, 45. Roller 42 is particularly adapted to engage the upper surface of the second image recording media 27 as the carrier is drawn into engagement with the gripping means 38. After the vacuum has been drawn by gripping means 38, and the discs begin to rotate, roller means 42 will traverse the surface of said second image recording media to thereby roll out any air trapped between the first and second image recording media.

Figure 6:
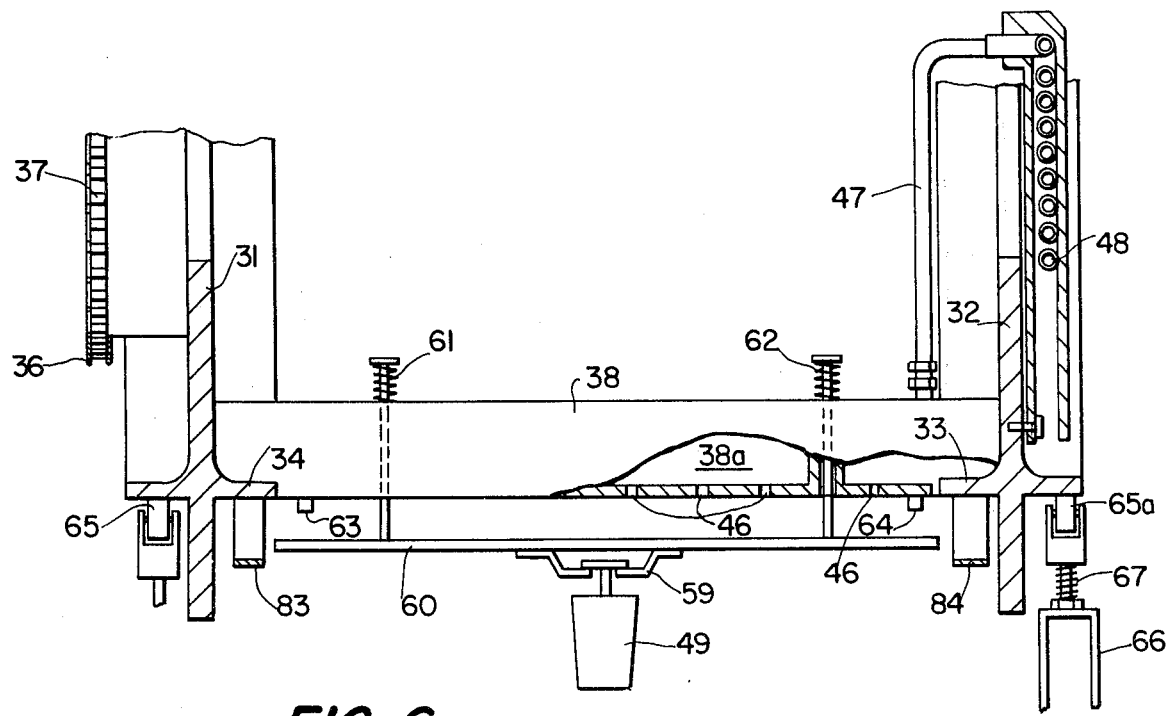
FIG. 6 is a cross section view taken along Section Line 6—6 of FIG. 5.

The gripping means of the present invention is more fully disclosed in FIG. 6. The gripping means 38 includes a manifold member 38a which has a plurality of apertures 46 defined therein which are adapted to engage manifold means 23 defined on flexible carrier 10. The air is exhausted from the manifold 38a through conduit 47 and a coiled flexible conduit 48. The coiled flexible conduit is then connected to a vacuum pump located in the frame of the device for exhausting the air through the coiled vacuum hose 48, conduit 47, manifold 38a, apertures 46, manifold 23, vacuum passageways 17, and peripheral vacuum channel 20. The coiled flexible vacuum conduit 48 permits rotation of the discs as they load and unload the carriers.

The carrier engaging or gripping means illustrated in FIG. 6 is positioned to load a carrier. An air cylinder 49 has engaged the carrier clamp 60 and drawn it downwardly against the preloaded spring bias exerted by springs 61 and 62.

The operator initiates the loading operation by manually inserting a loaded carrier into the carrier engaging clamp 60. As the carrier is inserted, registration pins 63, 64 will engage the registration openings 24, 25 on the carrier and correctly align the carrier. An electrical contact (not shown) is made by the leading edge of the carrier 10 as it is inserted into the carrier clamp 60. This insertion initiates the automatic loading of the carrier 10. After the contacts (not shown) are bridged by the carrier, the electrical circuitry disengages air cylinder 49, which allows spring 61, 62 to bias the carrier manifold 23 into engagement with the vacuum manifold 38a. After a vacuum is established through the carrier, a vacuum transducer (not shown) initiates the motor means 35 to rotate discs 31, 32. The discs are retained for rotation in the frame of the device by means of a plurality of equally spaced support rollers 65, 66 and 67. As illustrated in FIG. 6, rollers 65 and 65a are engaging the outer surface of discs 31 and 32 to support them for rotation about a common axis. Roller 65a is connected to the frame 66 of the device by means of an adjustment means 67. The use of an adjustment means on the rollers provides for precise positioning of the axis of rotation of the discs. In the preferred embodiment, it was found that three equally spaced support rollers provided accurate registration of the cylindrical reference plane with respect to the axis of the laser scanning apparatus.

The present invention includes a pair of banding straps 83, 84 shown in FIG. 6 which are secured to the gripping means 38. Strap 83 is provided for disc 31, while strap 84 is provided for disc 32. As the discs 31, 32 rotate, the straps 83, 84 are wrapped around the outside of carrier 10 to force the reference strips 15, 16 into firm engagement with cylindrical reference discs 33, 34.

Figure 11:
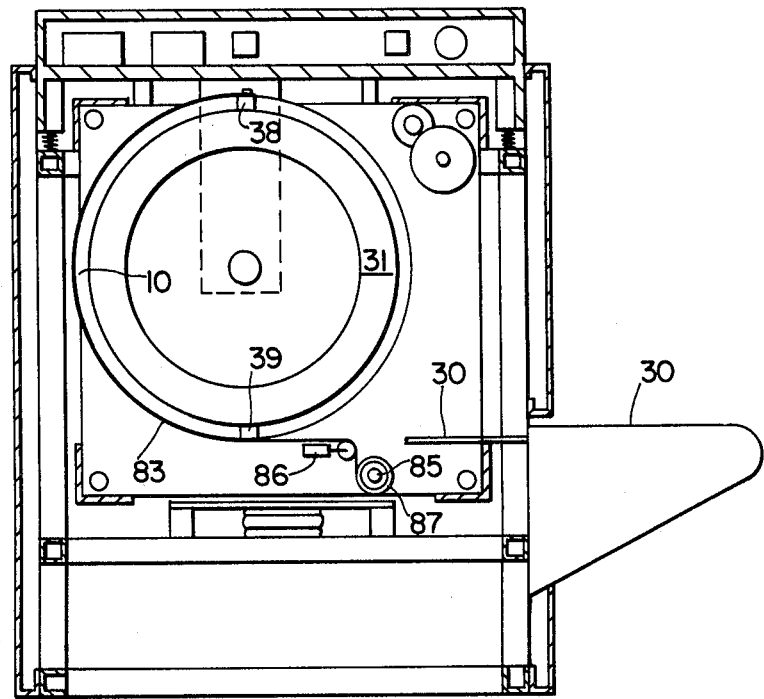
FIG. 11 is a diagramatic view of the mechanism illustrated in FIG. 9 which further illustrates the banding straps of the present invention.

As illustrated in FIG. 11, the banding strap 83 is stored on a take up reel 85 attached to an air motor 87 mounted below cylindrical disc 31. A similar take up reel and motor (not shown) is provided for banding strap 84 below disc 32.

As illustrated in FIG. 11, the spaced cylindrical disc 31 has rotated 180 degrees and has unwound banding strap 83. When the second carrier is engaged by gripping means 39, the cylindrical disc 31 again rotates through 180 degrees to bring gripping means 38 back to its original position, as shown in FIG. 9. The banding straps 83 and 84 then completely surround carriers 10 and 10b and an air brake is actuated in each of the air motors. After the air brakes have been set, air cylinder 86 is used to apply tension to banding strap 83 and a corresponding air cylinder (not shown) is used to tension banding strap 84. As banding straps 83, 84 are tensioned they force the reference strips 15, 16 of carrier 10 and reference strips 15b and 16b of carrier 10b into firm mating engagement with the cylindrical reference discs 33 and 34. When the carriers are secured and the banding straps have been tensioned, the first and second image recording media 26, 27 in each carrier are exposed to a helically scanned beam of modulated radiant energy focused on the media at the precise cylindrical reference plane. After the printing plates have been written, rotation of the cylindrical discs is initiated in the reverse direction, and carrier 10b is backed out of engagement with the spaced cylindrical discs and onto support surface 30 as illustrated in FIG. 9. After carrier 10b has been manually removed, the discs are rotated a second 180 degrees to disengage carrier 10 from discs 33 and 34. As indicated in FIG. 6, air solenoid 49 engages bracket means 59 mounted on the underside of retaining bar 60 and withdraws bar 60 each time that a carrier is withdrawn from the machine.

Figure 10:
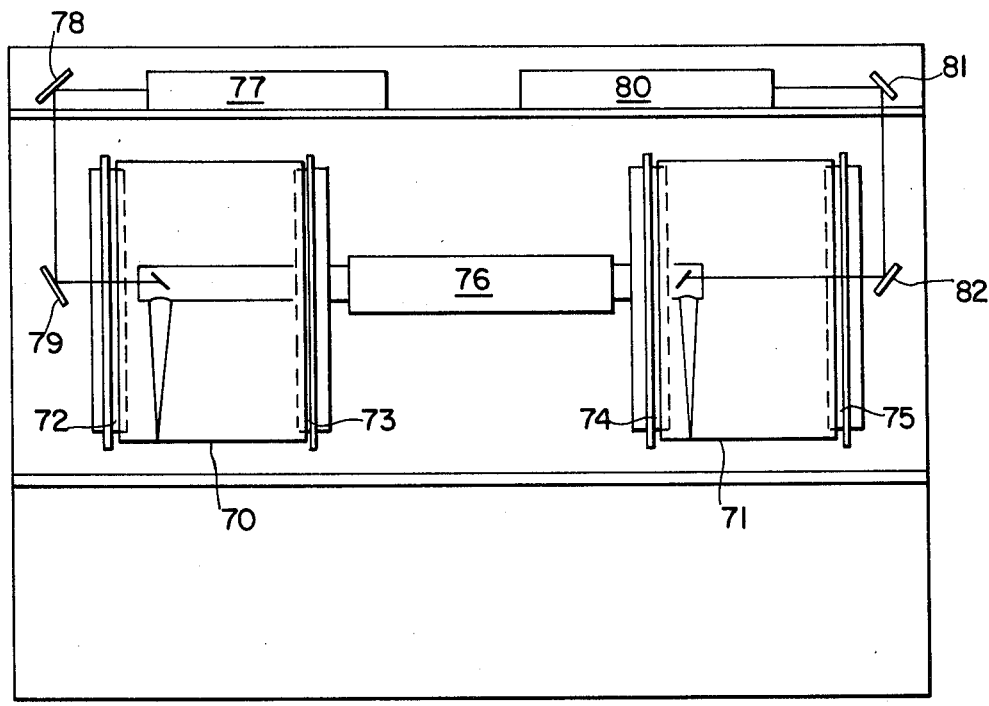
FIG. 10 is a diagramatic view of a laser scanning apparatus using the carriers and transport mechanism of the present invention.

As illustrated in FIG. 10, the preferred embodiment of the device utilizes a pair of cylindrical reference surfaces 70, 71. The first pair of spaced cylindrical discs 72, 73 define a reading station and the second pair of spaced support discs 74, 75 define a writing station. Traveling between the reading and writing station is a helical laser scanning apparatus generally indicated at 76 which is more fully described in my current co-pending application which will issue as U.S. Pat. No. 4,131,916 on Dec. 26, 1978 entitled "Pneumatically Actuated Image Scanning Reader/Writer." The beam from a helium neon laser 77 is reflected through mirrors 78 and 79 to read the indicia-carrying copy which has been placed in a carrier and formed into the precise cylindrical reference plane 70. Corresponding printing plates are written by the beam from an infrared laser 80 reflected through mirrors 81 and 82 to the helical scanning means 76 to provide a finely focused beam of laser energy at the cylindrical reference plane 71.

While the preferred embodiment of the invention has been described in detail, it is to be understood that various modifications and alterations could be made without departing from its spirit. Accordingly, the invention is limited only insofar as is defined by the scope of the following claims.

I claim:

1. An apparatus for transporting and forming a flat image receiving medium to a precise curvature for recording an image thereon, said apparatus comprising:
   (a) a pair of spaced cylindrical reference discs mounted for rotation about a common axis, the periphery of said discs defining a precise cylindrical plane therebetween;
   (b) a flexible carrier having a first leading edge, said flexible carrier being rigid in a first planar axis parallel to said leading edge and flexible in a second planar axis at right angles to said first axis, said carrier having a pair of reference strips positioned to engage the spaced cylindrical discs, thereby to define a neutral axis of curvature at their respective points of contact with the discs, said carrier also defining a planar surface for supporting and transporting an image receiving media;
   (c) gripping means carried by said cylindrical discs for engaging and gripping said first leading edge of said carrier and securing it tangentially to the periphery of said discs; and
   (d) means for rotating said discs after said gripping means have engaged said carrier to wrap said carrier around said discs, whereby the planar surface of said carrier is formed into a precise cylindrical plane concentric with the axis of said discs.

2. Apparatus for transporting and forming flat image receiving medium to a precise curvature for recording an image thereon as claimed in claim 1 said apparatus further comprising a pair of banding straps for securing said carrier to the periphery of said discs after said carrier has been wrapped around said discs.

3. Apparatus for transporting and forming a flat image receiving medium to a precise curvature for recording an image thereon as claimed in claim 1, wherein said planar surface for accommodating the image receiving media is at or outside the neutral axis of curvature defined between said reference strips and the peripheries of said discs.

4. Apparatus for transporting and forming a flat image receiving medium to a precise curvature for recording an image thereon as claimed in claim 3, wherein said carrier defines a supporting surface for two image recording media, the first media being immediately adjacent a portion of the carrier and outside the neutral axis of curvature, and the second media overlying the first media and being supported at or outside the neutral axis of curvature defined by said precise cylindrical plane.

5. Apparatus for transporting and forming a flat image recording medium to a precise curvature for recording an image thereon as claimed in claim 1, wherein said apparatus further comprises:
   (a) a carrier which defines a supporting surface for two superimposed image receiving media, the first media being immediately adjacent a portion of said carrier and outside the neutral axis of curvature, and the second medium overlying the first media and being supported at or outside the neutral axis of curvature defined by said precise cylindrical plane, (b) said carrier further defining a plurality of vacuum passageways therein for evacuating air from between said image receiving media and said carrier, and a peripheral vacuum channel defined by said carrier around said first image receiving media for evacuating air trapped between said first and second media, and between said second media and said carrier.

6. An apparatus for transporting and forming a flat image receiving medium to a precise curvature as claimed in claim 5, wherein said apparatus further comprises vacuum ports defined by said gripping means to mate with the vacuum passageways defined by said carrier, whereby the air extracted from between said image media and said carrier is exhausted through said gripping means.

7. An apparatus for transporting and forming a flat image recording medium to a precise curvature for recording an image thereon as claimed in claim 5, wherein said apparatus further comprises a roller means for engaging and traversing the outer surface of said carrier and said second media to roll out any air trapped thereunder.

8. Apparatus for transporting and forming a flat image receiving medium to a precise curvature for recording an image thereon as claimed in claim 5, said apparatus further defining an air pressure sensing means to initiate the rotation of said reference discs after a vacuum has been drawn in said carrier.

9. An apparatus for transporting and forming a flat image receiving medium to a precise curvature for image recording thereon as claimed in claim 1, wherein said cylindrical discs support a plurality of gripping means spaced around the discs for engaging a plurality of carriers which define supporting surfaces for a plurality of said image receiving media.

10. An apparatus for transporting and forming a flat image receiving media to a precise curvature for image recording thereon as claimed in claim 1, wherein said apparatus further comprises:
(a) a plurality of passageways defined by said carrier for evacuating air from between said image recording media and said carrier,
(b) vacuum ports defined by said gripping means to mate with the vacuum passageways defined by said carrier, whereby the air exhausted from between said image medium and said carrier is exhausted through said gripping means.

11. An apparatus for transporting a flat image recording medium and for forming it to a precise curvature for image recording thereon as claimed in claim 10, wherein said carrier further comprises at least two retaining flaps, said flaps hingedly mounted on said recording medium and effecting a vacuum seal around its outer periphery.

12. Apparatus for transporting first and second superimposed image receiving medium and for forming them to a precise curvature, for image recording thereon, said apparatus comprising:

(a) a pair of spaced cylindrical reference discs mounted for rotation about a common axis,
(b) a flexible record carrier defining a pair of flexible reference strips mounted thereon, said strips being spaced to engage the spaced cylindrical discs and define a precise cylindrical plane therebetween,
(c) first and second reference planes defined by said carrier for receiving and supporting first and second image receiving medium,
(d) vacuum passageways defined by said carrier for evacuating air trapped between said image media and said carrier,
(e) gripping means carried by said cylindrical discs for engaging and gripping said carrier and securing it to the periphery of said discs,
(f) means for rotating said discs after said gripping means have engaged said carrier to wrap said carrier around said discs whereby said reference planes defined by said carrier are positioned at or outside said precise cylindrical plane,
(g) means for exposing said image receiving medium to a focussed beam of modulated energy to record image information on said medium.

13. Apparatus for transporting first and second superimposed image receiving medium and for forming them to a precise curvature as claimed in claim 12, said apparatus further comprising a pair of circumferential banding straps for securing said carrier to said discs after said carrier has been wrapped around said discs.

14. Apparatus for transporting first and second superimposed image receiving medium and for forming them to a precise curvature as claimed in claim 12, said apparatus further comprising:
(a) a peripheral vacuum channel defined by said carrier around said first image receiving medium for evacuating air trapped between the plural media and between said first media and said carrier,
(b) vacuum ports defined by said gripping means to mate with the vacuum passageways defined by said carrier whereby the air exhausted from between said first image receiving media and the surface of said carrier, and from between said plural media, is exhausted through said gripping means.

15. Apparatus for transporting first and second superimposed image receiving medium and for forming them to a precise curvature as claimed in claim 14, wherein said apparatus further comprises roller means for engaging and traversing the planar surface of said carrier and said second media to roll out any air trapped therebetween.

16. Apparatus for transporting first and second superimposed image receiving medium and for forming them to a precise curvature as claimed in claim 14, said apparatus further defining an air pressure sensing means to initiate the rotation of said discs after a vacuum has been drawn in said carrier.

17. An apparatus for transporting first and second superimposed image receiving medium and for forming them to a precise curvature as claimed in claim 12, wherein said cylindrical discs support a plurality of gripping means spaced around the discs, for engaging a plurality of carriers which define supporting surfaces for said image receiving media.

* * * * *